US008836071B2

(12) United States Patent
Brown et al.

(10) Patent No.: US 8,836,071 B2
(45) Date of Patent: Sep. 16, 2014

(54) GALLIUM NITRIDE-BASED SCHOTTKY BARRIER DIODE WITH ALUMINUM GALLIUM NITRIDE SURFACE LAYER

(75) Inventors: Richard J. Brown, Los Gatos, CA (US); Thomas R. Prunty, Santa Clara, CA (US); David P. Bour, Cupertino, CA (US); Isik C. Kizilyalli, San Francisco, CA (US); Hui Nie, Cupertino, CA (US); Andrew P. Edwards, San Jose, CA (US); Linda Romano, Sunnyvale, CA (US); Madhan Raj, Cupertino, CA (US)

(73) Assignee: Avogy, Inc., San Jose, CA (US)

( * ) Notice: Subject to any disclaimer, the term of this patent is extended or adjusted under 35 U.S.C. 154(b) by 246 days.

(21) Appl. No.: 13/300,009

(22) Filed: Nov. 18, 2011

(65) Prior Publication Data
US 2013/0126886 A1 May 23, 2013

(51) Int. Cl.
*H01L 29/47* (2006.01)
*H01L 29/872* (2006.01)
*H01L 29/66* (2006.01)
*H01L 29/20* (2006.01)

(52) U.S. Cl.
CPC ....... *H01L 29/66143* (2013.01); *H01L 29/2003* (2013.01); *H01L 29/872* (2013.01)
USPC ............................ 257/471; 257/485; 438/570

(58) Field of Classification Search
CPC ..... H01L 29/475; H01L 29/47; H01L 29/872; H01L 29/66143; H01L 29/66212
USPC .................... 257/76, 471–486; 438/167–185, 438/570–583
See application file for complete search history.

(56) References Cited

U.S. PATENT DOCUMENTS

| 5,105,242 A | 4/1992 | Fujihira et al. |
| 6,768,146 B2 * | 7/2004 | Yoshida ......................... 257/279 |
| 6,949,774 B2 * | 9/2005 | Parikh et al. ................... 257/104 |
| 7,531,889 B2 * | 5/2009 | Kiyama et al. ................ 257/615 |
| 7,915,643 B2 * | 3/2011 | Suh et al. ....................... 257/194 |
| 2010/0059761 A1 * | 3/2010 | Horii et al. ...................... 257/76 |
| 2011/0297954 A1 * | 12/2011 | Okamoto et al. ............... 257/76 |

OTHER PUBLICATIONS

"Two dimensional electron gases induced by spontaneous and piezo-electric polarization in undoped and doped AlGaN/GaN heterostructures" by Ambacher et al., Journal of Applied Physics (vol. 87, Issue: 1), Jan. 2000 pp. 334-344.*
III-V Nitride Semiconductors Applications and Devices, edited by E.T. Yu and M.O. Manasreh, Taylor and Francis Books, Inc., 2003.*

* cited by examiner

*Primary Examiner* — Mark Tornow
*Assistant Examiner* — Eric Ward
(74) *Attorney, Agent, or Firm* — Kilpatrick Townsend & Stockton LLP (57) ABSTRACT

A method of fabricating a Schottky diode using gallium nitride (GaN) materials includes providing an n-type GaN substrate having a first surface and a second surface. The second surface opposes the first surface. The method also includes forming an ohmic metal contact electrically coupled to the first surface of the n-type GaN substrate and forming an n-type GaN epitaxial layer coupled to the second surface of the n-type GaN substrate. The method further includes forming an n-type aluminum gallium nitride (AlGaN) surface layer coupled to the n-type GaN epitaxial layer and forming a Schottky contact electrically coupled to the n-type AlGaN surface layer.

28 Claims, 6 Drawing Sheets

GALLIUM NITRIDE-BASED SCHOTTKY BARRIER DIODE WITH ALUMINUM GALLIUM NITRIDE SURFACE LAYER

CROSS-REFERENCES TO RELATED APPLICATIONS

The following regular U.S. patent applications (including this one) are being filed concurrently, and the entire disclosure of the other application is incorporated by reference into this application for all purposes:
application Ser. No. 13/30,009, filed Nov. 18, 2011, entitled "GAN-BASED SCHOTTKY BARRIER DIODE WITH ALGAN SURFACE LAYER"; and
application Ser. No. 13/30,028, filed Nov. 18 2011, entitled "GAN-BASED SCHOTTKY BARRIER DIODE WITH FIELD PLATE".

BACKGROUND OF THE INVENTION

Power electronics are widely used in a variety of applications. Power electronic devices are commonly used in circuits to modify the form of electrical energy, for example, from AC to DC, from one voltage level to another, or in some other way. Such devices can operate over a wide range of power levels, from milliwatts in mobile devices to hundreds of megawatts in a high voltage power transmission system. Despite the progress made in power electronics, there is a need in the art for improved electronics systems and methods of operating the same.

SUMMARY OF THE INVENTION

The present invention relates generally to electronic devices. More specifically, the present invention relates to techniques for providing a Schottky barrier diode using III-nitride semiconductor materials and having a surface layer that modifies the performance of the Schottky barrier diode. Merely by way of example, the invention has been applied to methods and systems for manufacturing Schottky barrier diodes using one or more gallium-nitride (GaN) based epitaxial layers and an aluminum gallium nitride (AlGaN) surface layer. The methods and techniques can be applied to create diodes for a variety of applications that can benefit from the low leakage current of the diodes.

According to an embodiment of the present invention, a method of fabricating a Schottky diode using gallium nitride (GaN) materials is provided. The method includes providing an n-type GaN substrate having a first surface and a second surface. The second surface opposes the first surface. The method also includes forming an ohmic metal contact electrically coupled to the first surface of the n-type GaN substrate and forming an n-type GaN epitaxial layer coupled to the second surface of the n-type GaN substrate. The method further includes forming an n-type aluminum gallium nitride (AlGaN) surface layer coupled to the n-type GaN epitaxial layer and forming a Schottky contact electrically coupled to the n-type AlGaN surface layer.

According to another embodiment of the present invention, a semiconductor device is provided. The semiconductor device includes a III-nitride substrate having a first surface and a second surface opposing the first surface and a first metallic structure electrically coupled to the first surface of the III-nitride substrate and forming an ohmic contact with the III-nitride substrate. The semiconductor device also includes a III-nitride epitaxial region characterized by a first bandgap and coupled to the second surface of the III-nitride substrate and a surface region characterized by a second bandgap and coupled to the III-nitride epitaxial region. The second bandgap is greater than the first bandgap. The semiconductor device further includes a second metallic structure electrically coupled to the surface region and forming a Schottky contact with the surface region.

According to an alternative embodiment of the present invention, a method of fabricating an epitaxial structure is provided. The method includes providing a III-nitride substrate characterized by a certain conductivity type and having a first surface and a second surface. The second surface opposes the first surface. The method also includes forming an ohmic contact electrically coupled to the first surface of the III-nitride substrate and forming a III-nitride epitaxial region of the certain conductivity type coupled to the second surface of the III-nitride substrate. The III-nitride epitaxial region is characterized by a first bandgap. The method further includes forming a surface region coupled to the III-nitride epitaxial region. The surface region is characterized by a second bandgap greater than the first bandgap. Additionally, the method includes forming a Schottky contact electrically coupled to the surface region.

Numerous benefits are achieved by way of the present invention over conventional techniques. For example, embodiments of the present invention provide diodes having lower leakage current and increased reverse breakdown voltage in comparison with conventional devices. Additionally, embodiments can utilize materials in surface layers that are more stable and easier to handle in manufacturing than conventional materials.

Another advantage provided by embodiments of the present invention over conventional devices is based on the superior material properties of GaN-based materials. Embodiments of the present invention provide homoepitaxial GaN layers on bulk GaN substrates that are imbued with superior properties to other materials used for power electronic devices. High electron mobility, $\mu$, is associated with a given background doping level, N, which results in low resistivity, $\rho$, since $\rho=1/q\mu N$.

The ability to obtain regions that can support high voltage with low resistance compared to similar device structures in other materials allows embodiments of the present invention to provide resistance properties and voltage capability of conventional devices, while using significantly less area for the GaN device. Capacitance, C, scales with area, approximated as $C=\epsilon A/t$, so the smaller device will have less terminal-to-terminal capacitance. Lower capacitance leads to faster switching and less switching power loss.

These and other embodiments of the invention along with many of its advantages and features are described in more detail in conjunction with the text below and attached figures.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF SPECIFIC EMBODIMENTS

The present invention relates generally to electronic devices. More specifically, the present invention relates to techniques for providing a Schottky barrier diode using III-nitride semiconductor materials and having a surface layer that modifies the performance of the Schottky barrier diode. Merely by way of example, the invention has been applied to methods and systems for manufacturing Schottky barrier diodes using one or more gallium-nitride (GaN) based epitaxial layers and an aluminum gallium nitride (AlGaN) surface layer. The methods and techniques can be applied to create diodes for a variety of applications that can benefit from the low leakage current associated with the diode.

The speed and efficiency of the Schottky barrier diode (SBD) render such metal-semiconductor devices suitable for many applications in today's world of modern electronics. Although the simplicity of the SBD's design can provide for the device's low junction capacitance and ultra-fast switching action, it can also present some performance-related drawbacks. One notable drawback is the fact that SBDs typically have a relatively high leakage current under reverse bias. Additionally, processing techniques can damage the crystal surface of some semiconductor-based SBDs, thus compromising the quality of the Schottky contact. Techniques disclosed herein provide for an improved SBD structure that can offer greater chemical stability during manufacture as well as a reduced reverse leakage current without sacrificing many of the characteristics for which the SBD might be used.

Figure 1:
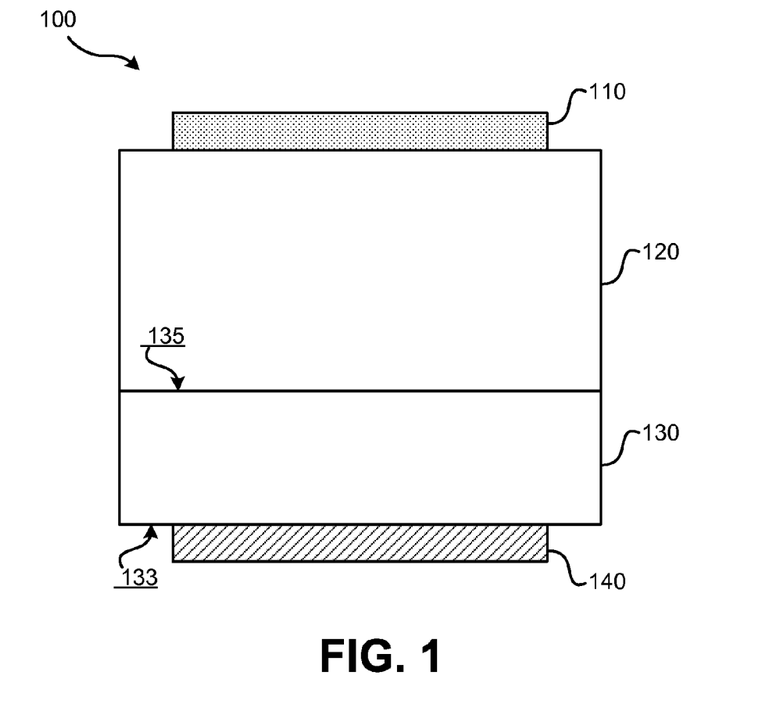
FIG. 1 is a simplified cross-sectional diagram of a GaN-based Schottky barrier diode (SBD)

FIG. 1 is a simplified cross-sectional diagram of an embodiment of a GaN-based SBD 100. In the illustrated embodiment, a substrate 130, which will be a cathode of the GaN-based SBD 100, is an n-type GaN substrate, but different embodiments can include different materials. In other embodiments, for example, substrates with p-type doping are utilized. Additionally, although a GaN substrate and GaN epitaxial layers are utilized in the GaN-based SBD 100 illustrated in FIG. 1, other embodiments are not limited to GaN substrates and GaN epitaxial layers. Other III-V materials, in particular, III-nitride materials, are included within the scope of the present invention and can be substituted not only for the illustrated substrate 130, but also for other GaN-based layers and structures described herein, such as epitaxial layer 120. As examples, binary III-V (e.g., III-nitride) materials, ternary III-V (e.g., III-nitride) materials such as InGaN and AlGaN, quaternary III-nitride materials, such as AlInGaN, doped versions of these materials, and the like are included within the scope of the present invention. Additionally, embodiments can use materials having an opposite conductivity type (e.g., p-type or n-type) to provide devices with different functionality.

Although some examples relate to the growth of n-type GaN epitaxial layer(s) doped with silicon, in other embodiments the techniques described herein are applicable to the growth of highly or lightly doped material, p-type material, material doped with dopants in addition to or other than silicon such as Mg, Ca, Be, Ge, Se, S, O, Te, Zn, C, and the like. The substrates discussed herein can include a single material system or multiple material systems including composite structures of multiple layers. One of ordinary skill in the art would recognize many variations, modifications, and alternatives.

An ohmic contact 140 is electrically coupled to a first surface 133 of the substrate 130. The ohmic contact 140 can be one or more layers of ohmic metal that serve as an electrical contact for the cathode of the GaN-based SBD 100. For example, the ohmic contact 140 can comprise a titanium-aluminum (Ti/Al) ohmic metal. Other metals and/or alloys can be used including, but not limited to, aluminum, nickel, gold, combinations thereof, or the like. In some embodiments, an outermost metal of the ohmic contact 140 can include gold, tantalum, tungsten, palladium, silver, or aluminum, combinations thereof, and the like. The ohmic contact 140 can be formed using any of a variety of methods such as sputtering, evaporation, or the like.

Coupled to a second surface 135 of the substrate 130 opposite the first surface 133, is an epitaxial layer 120, which provides a drift region of n-type GaN material for the GaN-based SBD 100. The epitaxial layer 120 will therefore have properties such as thickness and doping concentration that are determined by the design of the GaN-based SBD 100. In typical embodiments, the thickness of the epitaxial layer 120 can be between about 1 μm to about 100 μm and the doping concentration can be between about $1 \times 10^{14}$ cm$^{-3}$ to about $1 \times 10^{17}$ cm$^{-3}$. In other embodiments, the thickness and doping concentration are modified as appropriate to the particular application. Additional description related to thicknesses, dopant concentrations, and breakdown voltages of the drift layer are provided in U.S. patent application Ser. No. 13/198,655, filed on Aug. 4, 2011, the disclosure of which is hereby incorporated by reference in its entirety.

The GaN-based SBD 100 further includes a Schottky contact 110 electrically coupled to the epitaxial layer 120. In some embodiments, a surface of the epitaxial layer to which the Schottky contact is coupled can be treated to place it in a condition suitable to create a Schottky barrier. The Schottky contact 110 comprises one or more Schottky metals that are deposited and patterned to form the Schottky contact 110. Examples of Schottky metals include nickel, palladium, platinum, combinations thereof, or the like. The geometry of the Schottky contact 110 will be a function of the device geometry for the GaN-based SBD 100, and can vary depending on desired functionality. One of ordinary skill in the art would recognize many variations, modifications, and alternatives.

Figure 2:
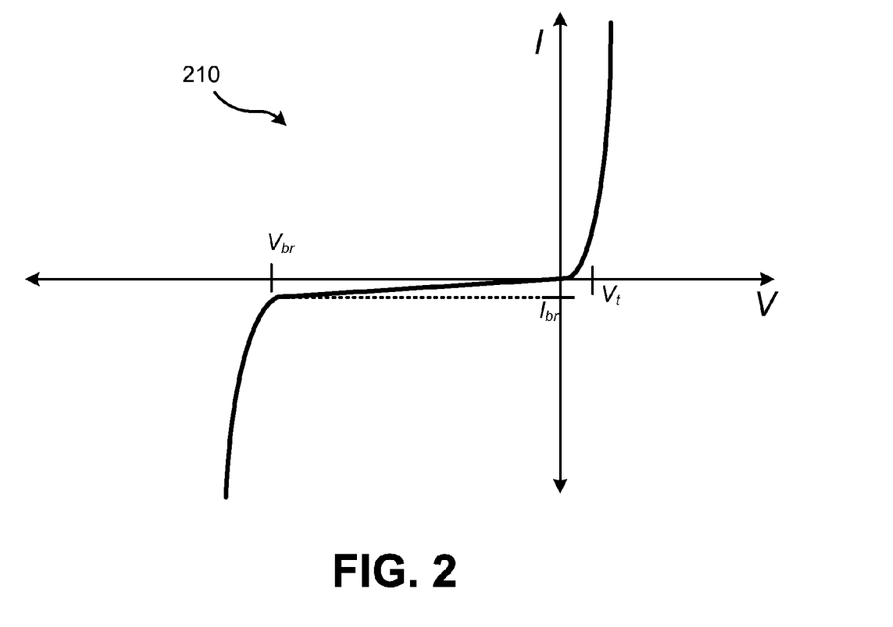
FIG. 2 is a graph providing the general I-V characteristics of the GaN-based SBD shown in FIG. 1.

FIG. 2 is a graph providing the I-V characteristics of the GaN-based SBD 100 shown in FIG. 1. The I-V plot 210 shows current of the GaN-based SBD 100 as a function of voltage. As illustrated, when compared with the turn-on voltage, $V_t$, the GaN-based SBD 100 is able to sustain high voltages under reverse bias before reaching the breakdown threshold, $V_{br}$. This is not without some leakage current, however, which increases with increased reverse bias. The amount of leakage current at the breakdown threshold $V_{br}$, for example, is indicated by $I_{br}$. Such leakage current is undesirable in most applications.

Figure 3:
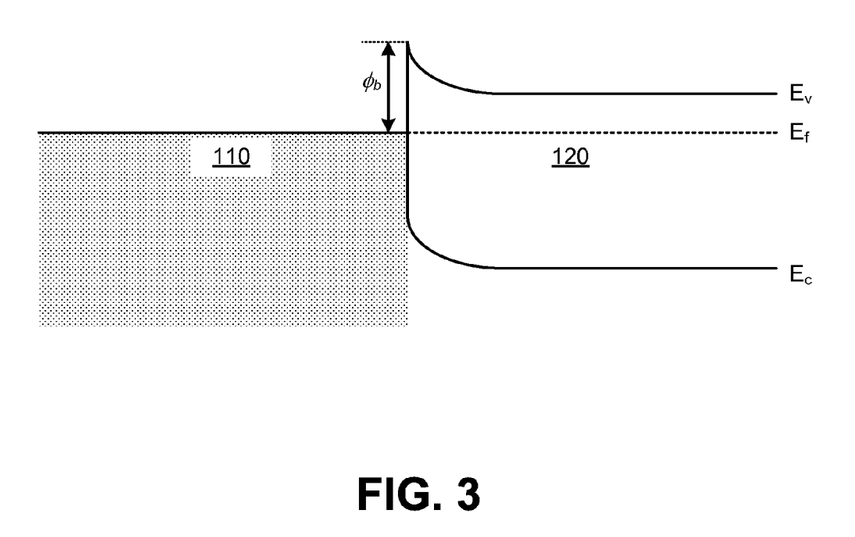
FIG. 3 is an energy band diagram illustrating the interface between the Schottky contact and the epitaxial layer of the GaN-based SBD of FIG. 1.

FIG. 3 is an energy band diagram illustrating the interface between the Schottky contact 110 and the epitaxial layer 120 of the GaN-based SBD 100, which can provide additional insight into the cause of the leakage current. The valence band, conduction band, and Fermi level of the epitaxial layer 120 are labeled $E_v$, $E_c$, and $E_f$, respectively. The energy band diagram illustrates the barrier height, $\phi_b$, associated with injection of electrons from the Schottky contact 110 into the n-type GaN material of the epitaxial layer 120 in forward bias. The barrier height $\phi_b$ also plays a role in suppressing electron leakage from the epitaxial layer 120 to the Schottky contact 110 in reverse bias. Thus, Schottky contacts having a large barrier height $\phi_b$ are generally less susceptible to reverse bias leakage current. With this principle in mind, additional measures can be taken to reduce the reverse bias leakage current of GaN-based SBD 100.

Figure 4:
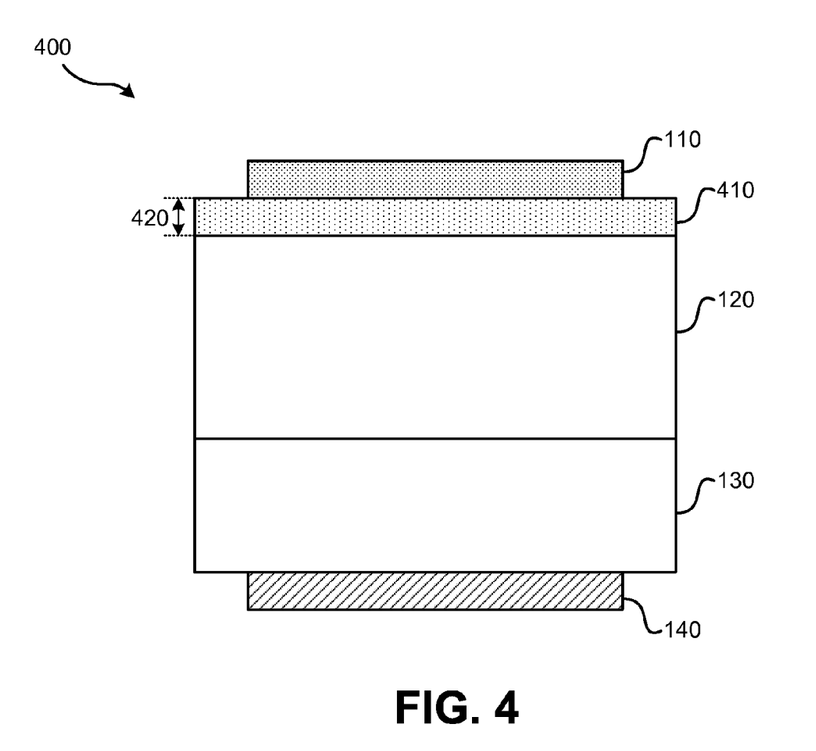
FIG. 4 is a simplified cross-sectional diagram of a GaN-based SBD according to an embodiment of the present invention.

FIG. 4 illustrates an embodiment of a GaN-based SBD 400 according to an embodiment of the present invention. The features of the GaN-based SBD 400, such as physical dimensions, doping levels, and the like, are similar to corresponding features of the GaN-based SBD 100 of FIG. 1. Additionally, similar to the GaN-based SBD 100 of FIG. 1, the improvements illustrated by the improved GaN-based SBD 400 illustrated in FIG. 4 also may be implemented in diodes comprising other materials, including other III-nitride materials. Referring to FIG. 4, the GaN-based SBD 400 includes an additional feature not illustrated in FIG. 1: a surface layer 410, also referred to as a surface region, disposed between the epitaxial layer 120 and the Schottky contact 110.

The surface layer 410 can include a material with a larger band gap than the epitaxial layer 120 and the same conductivity type as the epitaxial layer. This can increase the barrier height of the Schottky barrier, which may reduce the reverse bias leakage current of GaN-based SBD 100. The surface layer 410 can include any of a variety of materials, which can vary depending on desired functionality, manufacturing concerns, and other factors. In embodiments where the epitaxial layer 120 comprises a GaN material, for example, the epitaxial layer 120 can include any combination aluminum gallium nitride (AlGaN), aluminum nitride (AlN), aluminum indium nitride (AlInN), aluminum gallium indium nitride (AlGaInN), and the like. Embodiments having an epitaxial layer including materials other than GaN may utilize different materials in the surface layer. To avoid a rectifying junction between the surface layer 410 and the epitaxial layer, the surface layer 410 can be doped such that it has the same electrical conductivity type as the epitaxial layer. For example, in one embodiment, the surface layer comprises an n-type AlGaN layer, and the epitaxial layer 120 comprises an n-type GaN epitaxial layer. In other embodiments, the surface layer 410 is undoped. One of ordinary skill in the art would recognize many variations, modifications, and alternatives.

Among other advantages, the surface layer 410 can be more stable than the epitaxial layer 120. In the case where the surface layer 410 comprises n-type AlGaN and the epitaxial layer 120 comprises n-type GaN, for example, the n-type AlGaN surface layer offers enhanced chemical stability over n-type GaN. This provides a more durable semiconductor surface capable of withstanding the potentially damaging effects of lithographic and/or other processing. Ultimately, this can provide a cleaner interface for Schottky barrier, resulting in a better performing SBD.

Figure 5:
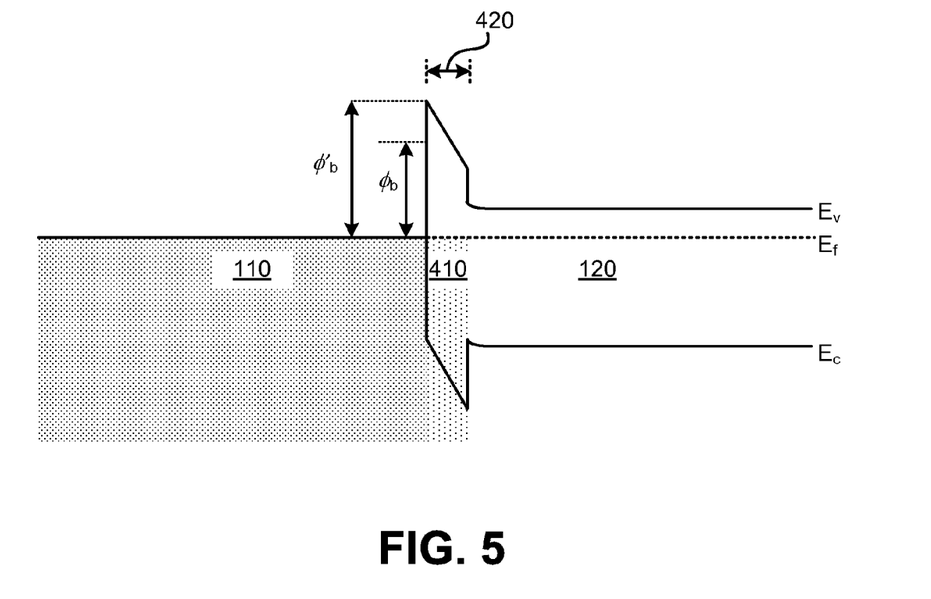
FIG. 5 is an energy band diagram of the interfaces between the Schottky contact, the surface layer, and the epitaxial layer of the GaN-based SBD illustrated in FIG. 4.

As alluded to earlier, the inclusion of the surface layer 410 can impact the band height of the height of the Schottky barrier formed between the Schottky contact 110 and the surface layer 410. FIG. 5 is an energy band diagram illustrating the interfaces between the Schottky contact 110, the surface layer, and the epitaxial layer 120 of the improved GaN-based SBD 400. When compared with FIG. 3, FIG. 5 illustrates how the surface layer 410 modifies the electrical behavior of the improved GaN-based SBD 400. For example a modified barrier height, $\phi'_b$, of the improved GaN-based SBD 400 is larger than the corresponding barrier height $\phi_b$ of the GaN-based SBD 100 of FIG. 1.

Figure 6:
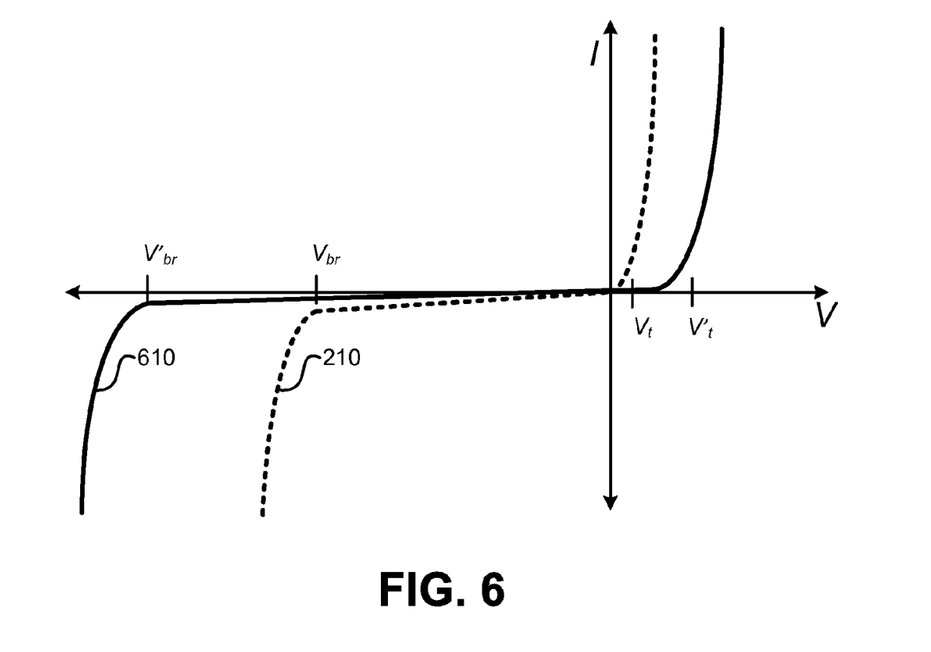
FIG. 6 is a graph providing the general I-V characteristics of the GaN-based SBD illustrated in FIG. 4 as compared with the GaN-based SBD illustrated in FIG. 1.

FIG. 6 is a graph illustrating the I-V characteristics of the GaN-based SBD 400 of FIG. 4 as compared with the GaN-based SBD 100 of FIG. 1. The I-V curves 610 and 210 show the behavior of the current of the GaN-based SBD 400 and the current of the GaN-based SBD 100, respectively, as a function of voltage. As illustrated, the inclusion of the epitaxial layer 120 enables the GaN-based SBD 400 to exhibit an increased reverse bias breakdown voltage $V'_{br}$ over the corresponding reverse bias breakdown voltage $V_{br}$ of the GaN-based SBD 100. As illustrated in FIG. 6, the epitaxial layer 120 included in GaN-based SBD 400 may result in a higher turn-on voltage $V'_t$ in comparison with the turn-on voltage $V_t$ of the GaN-based SBD 100. The amount of increase in the reverse bias breakdown voltage $V'_{br}$ and/or turn-on voltage $V'_t$ of the improved GaN-based SBD 400 over corresponding voltages of the GaN-based SBD 100 can vary, depending on the physical properties (e.g., material types, concentrations, etc.) of the materials included in the surface layer 410, among other factors.

Due to Fermi-level pinning and polarization differences, in addition to differences in the respective band gaps of the surface layer 410 and the epitaxial layer 120, the performance of the improved GaN-based SBD 400 can be impacted by the thickness 420 (FIGS. 4 and 5) of the surface layer 410 where the epitaxial layer 120 includes a polar material. A two-dimensional electron gas (2DEG), for example, is known to accumulate at certain heterojunctions, such as the heterojunction between the surface layer 410 and the epitaxial layer 120 in certain embodiments of the present invention. Such a 2DEG can impact the operation of the GaN-based SBD 400.

Figure 7A:
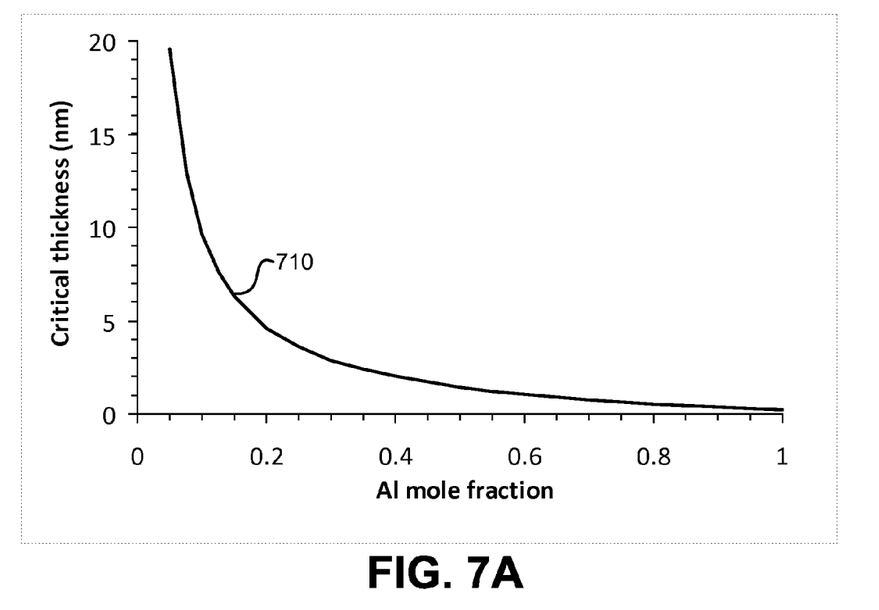
FIG. 7A is a graph that plots the critical thickness of an n-type AlGaN surface layer as a function of aluminum mole fraction according to an embodiment of the present invention.
Figure 7B:
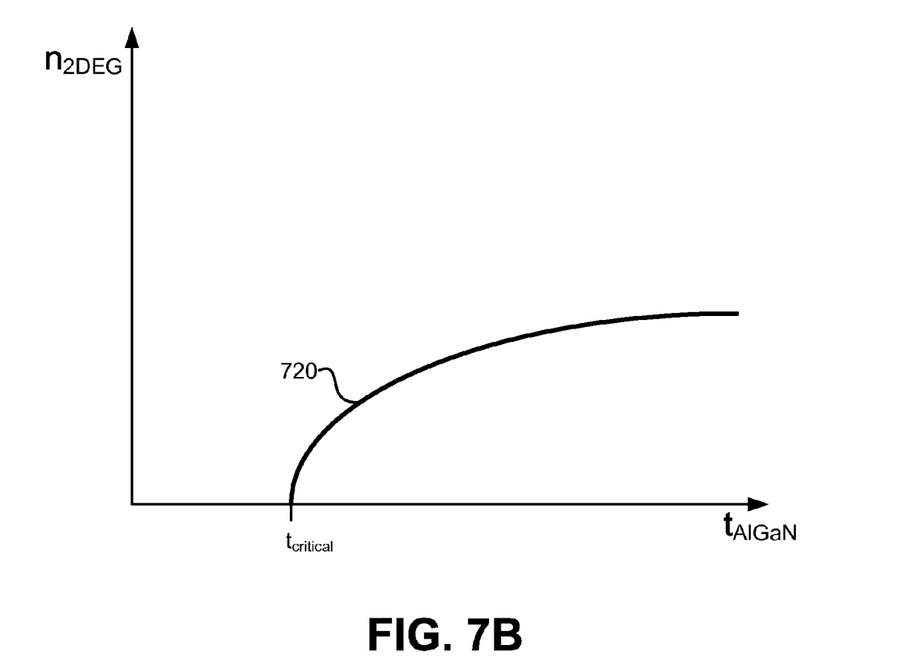
FIG. 7B is a graph that plots the carrier density of a two-dimensional electron gas (2DEG) as a function of surface layer thickness according to an embodiment of the present invention.

FIG. 7A shows a curve 710 of critical thickness in nanometers (nm) as a function of aluminum (Al) mole fraction, and FIG. 7B shows a curve 720 illustrating the relation between the critical thickness (indicated here as $t_{critical}$) and the 2DEG electron density, $n_{2DEG}$. Calculations of $n_{2DEG}$ as a function of critical thickness in heterojunctions comprising AlGaN and GaN (or other suitable materials) can be made using known methods. One such method is provided with equation 16a in O. Ambacher et al. "Two dimensional electron gases induced by spontaneous and piezoelectric polarization in undoped and doped AlGaN/GaN heterostructures," Journal of Applied Physics 87, 334 (2000), which is hereby incorporated by reference. The plots in FIGS. 7A and 7B of critical thickness as a function of Al mole fraction and the electron density of the 2DEG as a function of layer thickness are computed for an epitaxial layer 120 including polar (e.g., c-plane) n-type GaN material and an AlGaN surface layer 410, but other plots can be computed for other materials as will be evident to one of skill in the art.

Figure 8:
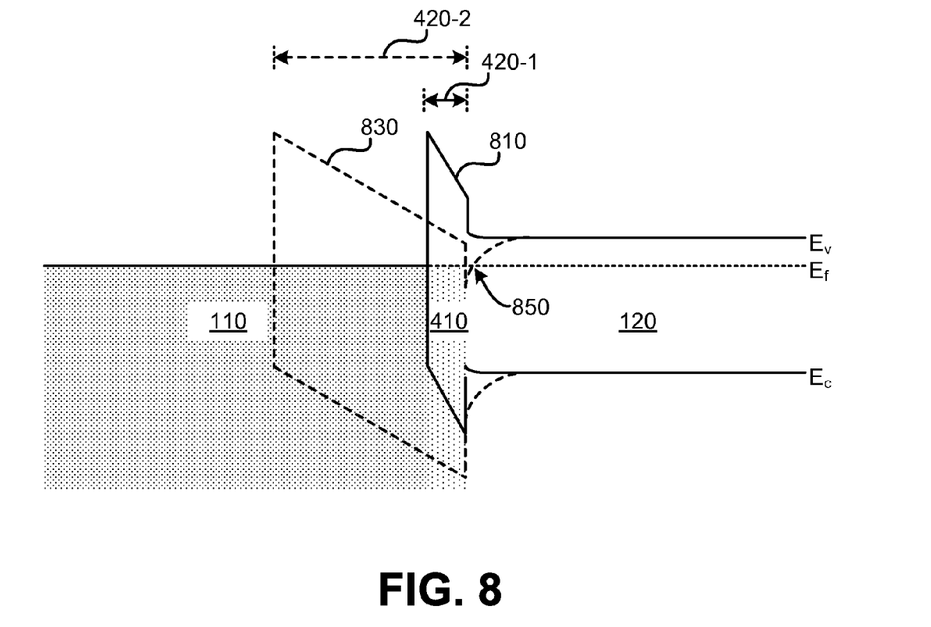
FIG. 8 is an energy band diagram illustrating the interfaces between the Schottky contact, the surface layer, and the epitaxial layer of the GaN-based SBD according to an embodiment of the present invention, showing different sets of bands for different thicknesses of the surface layer.

FIG. 8 is an energy band diagram of the interfaces between the Schottky contact 110, the surface layer 410, and the epitaxial layer 120 of the GaN-based SBD 400. A first set of bands 810 indicates where the surface layer 410 has a first thickness 420-1 that is less than $t_{critical}$, and a second set of bands 830 indicates where the surface layer 410 has a second thickness 420-2 that is greater than $t_{critical}$. As illustrated, when the surface layer thickness exceeds the value denoted $t_{critical}$, the Fermi level pinning on the surface forces the n-type GaN's energy bands downward, confining electrons to a substantially triangular potential well 850 at the n-type GaN/n-type AlGaN interface in which the charge is determined by polarization effects. The 2DEG that develops at the n-type GaN/n-type AlGaN interface also may be affected by processes that passivate the surface. The 2DEG is undesirable in most embodiments. Thus, precautions can be made such that creation of the 2DEG is avoided.

Referring again to FIG. 7A, the critical thickness (i.e., $t_{critical}$) of the n-type AlGaN surface layer 410 is shown to be reversely-proportional to the Al mole fraction of the n-type AlGaN surface layer 410. In other words, the more aluminum included in the n-type AlGaN surface layer 410, the thinner the n-type AlGaN surface layer 410 should be to prevent a 2DEG from forming. Embodiments can vary widely, depending the desired stoichiometry of the n-type AlGaN surface layer 410, among other factors. In some embodiments, for example, the n-type AlGaN surface layer 410 has a thickness of between 0.5 nm and 15 nm. As particular example, the n-type AlGaN surface layer 410 thickness can range from about 1 nm and about 3 nm. Other embodiments can include an n-type AlGaN surface layer 410 with a thickness greater than 15 nm or less than 0.5 nm. According to embodiments of the present invention, the n-type AlGaN surface layer 410 described herein prevents a 2DEG from forming at the interface between the AlGaN surface layer 410 and the n-type GaN epitaxial layer 120. In some embodiments, the AlGaN surface layer 410 can be a few monolayers in thickness.

Figure 9:
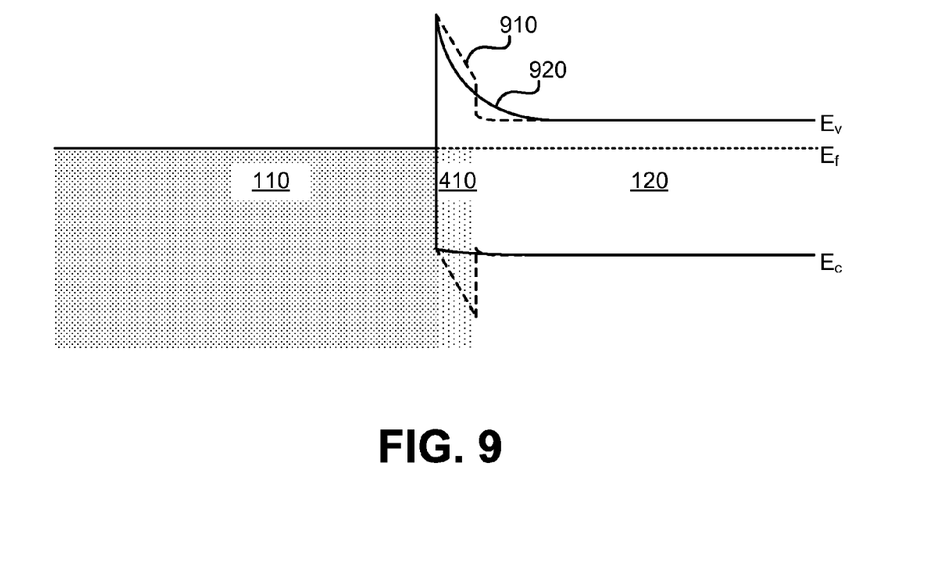
FIG. 9 is an energy band diagram of a graded surface layer, according to one embodiment of the present invention, as compared with a surface layer having uniform composition, according to another embodiment of the present invention.

In alternative embodiments, the composition of the n-type AlGaN surface layer 410 can be graded as a function of thickness. FIG. 9 is an energy band diagram of such a graded surface layer 410 as compared with a surface layer 410 having uniform composition. A first set of bands 910 correspond to a surface layer 410 having uniform composition, and a second set of bands 920 correspond to a graded surface layer 410. Current technology allows the profile of an n-type AlGaN surface layer 410 to be continuously graded so as to eliminate an abrupt composition step, thereby avoiding the formation of a 2DEG. For example, the concentration of aluminum in the n-type AlGaN surface layer 410 can increase as the distance to the Schottky contact 110 decreases. This results in the second set of bands 920 having a smoother profile, which is less susceptible to the formation of a 2DEG.

It will be understood that the materials with which an epitaxial layer is composed can have a great impact on any requirements concerning the thickness of a surface layer. For instance, nonpolar materials (e.g., a-plane and/or m-plane GaN) can be utilized in the epitaxial layer. In such a case, because there are no polarization effects that could result in the formation of a 2DEG, there are no associated maximum thickness requirements for the corresponding surface layer. Thus, rather than limiting the surface layer to as little as a few monolayers or less, a Schottky diode having an epitaxial region comprising nonpolar materials can have a surface layer of a far larger thickness, limited only by factors that do not involve the formation of a 2DEG (e.g., lattice mismatch that could result in a risk of physical cracking of a material layer). One of ordinary skill in the art will recognize that materials and/or conductivity types other than those discussed above may be utilized.

Figure 10:
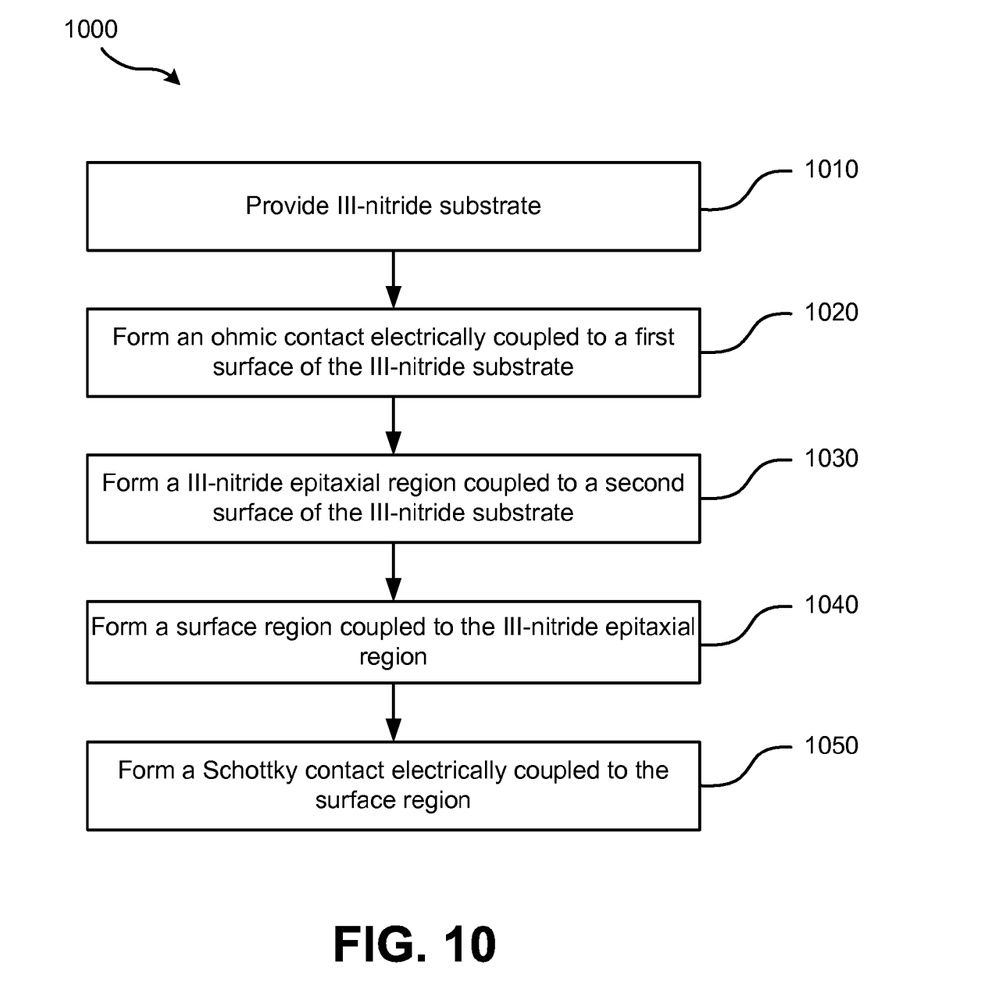
FIG. 10 is a simplified flowchart illustrating a method for fabricating a Schottky diode utilizing a surface layer as described herein, according to an embodiment of the present invention.

FIG. 10 is a simplified flowchart illustrating a method 1000 for fabricating a Schottky diode using III-nitride materials according to an embodiment of the present invention. The method 1000 includes providing a III-nitride substrate (1010). Referring to FIG. 4, for example, a bulk n-type GaN substrate 130 is provided. The III-nitride substrate can be characterized by a first surface and a second surface, where the second surface opposes the first surface. The properties of the III-nitride substrate, such as thickness, dopant concentration, and the like, can vary depending on desired functionality, among other concerns.

The method 1000 further includes forming an ohmic contact electrically coupled to the first surface of the III-nitride substrate (1020). In some embodiments, a single metallic layer is used to form the ohmic contact. Thicknesses or materials can vary to provide the ohmic properties appropriate to the device features. In other embodiments, multiple metallic layers (i.e., a multi-layer metallic structure) and/or multiple metals are utilized to form the ohmic contact. It will be understood that, in other embodiments, the formation of the epitaxial layers and ohmic contact can occur at different points in the fabrication of a Schottky diode, depending on manufacturing considerations.

An III-nitride epitaxial region coupled to the second surface of the III-nitride substrate is formed (1030). The epitaxial region, which can be a component of a drift region for the Schottky diode, can be formed by epitaxial growth on the III-nitride substrate. Furthermore, the epitaxial region can have any of a variety of physical properties, such as thickness, dopant concentration, polarity, and the like, depending on the desired functionality of the Schottky diode. As discussed previously, the thickness of the epitaxial region can be relatively large to accommodate high-power applications.

The method 1000 further includes forming a surface region coupled to the III-nitride epitaxial region (1040). As shown in FIG. 4, the surface region can be coupled to a surface of the III-nitride epitaxial region that is substantially opposite from the surface of the III-nitride epitaxial region coupled to the III-nitride substrate. Additionally, the surface region can be formed any of a variety of ways. For example, a material can be introduced into the III-nitride epitaxial region to form the surface region (e.g., introducing Al into a GaN epitaxial region to form an AlGaN surface region). Additionally or alternatively, the surface region can comprise a layer of material formed (e.g., grown, deposited, etc.) on the III-epitaxial region. As indicated previously, embodiments can include a surface region comprising a material including aluminum (e.g., AlGaN, AlN, AlInN, and the like), and the concentration of aluminum can be such that the aluminum mole fraction is highest near the surface of the surface region on which the Schottky contact is subsequently formed. Stated another way, the aluminum mole fraction increases as distance to the Schottky contact decreases.

The method 1000 also includes forming the Schottky contact electrically coupled to the surface region (1050). As indicated previously, the Schottky contact can comprise one or more Schottky metals that are deposited and patterned to form the Schottky contact on the surface region. Such metals include nickel, palladium, platinum, combinations thereof, or the like. In some embodiments, a surface of the surface region to which the Schottky contact is coupled can be treated to place it in a condition suitable to create the Schottky barrier. However, because the surface region may have increased chemical stability as compared with the III-nitride epitaxial region, there may be no need for such treatment.

It should be appreciated that the specific steps illustrated in FIG. 10 provide a particular method of fabricating a Schottky diode according to an embodiment of the present invention. Other sequences of steps may also be performed according to alternative embodiments. For example, alternative embodiments of the present invention may perform the steps outlined above in a different order. Moreover, the individual steps illustrated in FIG. 10 may include multiple sub-steps that may be performed in various sequences as appropriate to the individual step. Furthermore, additional steps may be added or removed depending on the particular applications. One of ordinary skill in the art would recognize many variations, modifications, and alternatives.

One of ordinary skill in the art would recognize many variations, modifications, and alternatives to the examples provided herein. As illustrated herein, physical characteristics and properties of the Schottky diodes described herein can vary, depending on desired functionality of the Schottky diode. For instance, the material(s) used in the surface layer can vary, providing different band gaps that can ultimately impact the performance of the Schottky diode by altering the reverse bias breakdown voltage, leakage current, and/or the turn-on voltage. Additionally or alternatively, conductivity types of the examples provided herein can be reversed (e.g., replacing an n-type semiconductor material with a p-type material, and vice versa), depending on desired functionality. Moreover, embodiments provided herein using GaN can use other III-nitride materials in addition or as an alternative to GaN. Other variations, alterations, modifications, and substitutions are contemplated.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of fabricating a Schottky diode using gallium nitride (GaN) materials, the method comprising:
    providing an n-type GaN substrate having a first surface and a second surface, the second surface opposing the first surface;
    forming an ohmic metal contact electrically coupled to the first surface of the n-type GaN substrate;
    forming an n-type GaN epitaxial layer coupled to the second surface of the n-type GaN substrate;
    forming an n-type aluminum gallium nitride (AlGaN) surface layer coupled to the n-type GaN epitaxial layer; and
    forming a Schottky contact electrically coupled to the n-type AlGaN surface layer,
    wherein, during operation, an interface between the n-type GaN epitaxial layer and the n-type AlGaN surface layer is substantially free from a two-dimensional electron gas, and
    wherein the n-type GaN epitaxial layer comprises a polar GaN material.

2. The method of claim 1, wherein the n-type AlGaN surface layer is characterized by a thickness between 0.5 nm and 15 nm.

3. The method of claim 2 wherein the thickness is between 1 nm and 3 nm.

4. The method of claim 1, wherein the n-type AlGaN surface layer is characterized by a graded aluminum mole fraction as a function of thickness.

5. The method of claim 4 wherein the aluminum mole fraction increases as a distance to the Schottky contact structure decreases.

6. A semiconductor device comprising:
    a III-nitride substrate having a first surface and a second surface opposing the first surface;
    a first metallic structure electrically coupled to the first surface of the III-nitride substrate and forming an ohmic contact with the III-nitride substrate;
    a III-nitride epitaxial region characterized by a first bandgap and coupled to the second surface of the III-nitride substrate;
    a surface region characterized by a second bandgap and coupled to the III-nitride epitaxial region, wherein the second bandgap is greater than the first bandgap; and
    a second metallic structure electrically coupled to the surface region and forming a Schottky contact with the surface region,
    wherein, during operation, an interface between the III-nitride epitaxial region and the surface region is substantially free from a two-dimensional electron gas, and
    wherein a thickness of the surface region is between 0.5 nm and 15 nm.

7. The semiconductor device of claim 6, wherein the thickness of the surface region is between 1 nm and 3 nm.

8. The semiconductor device of claim 6 wherein the surface region comprises at least one of aluminum gallium nitride (AlGaN), aluminum nitride (AlN), aluminum indium nitride (AlInN), or aluminum gallium indium nitride (AlGaInN).

9. The semiconductor device of claim 8 wherein a concentration of aluminum of the surface region is graded such that the concentration of aluminum increases as distance to the second metallic structure decreases.

10. A method of fabricating an epitaxial structure, the method comprising:
    providing a III-nitride substrate characterized by a certain conductivity type and having a first surface and a second surface, the second surface opposing the first surface;
    forming an ohmic contact electrically coupled to the first surface of the III-nitride substrate;
    forming a III-nitride epitaxial region of the certain conductivity type coupled to the second surface of the III-nitride substrate, wherein the III-nitride epitaxial region is characterized by a first bandgap;
    forming a surface region coupled to the III-nitride epitaxial region, wherein the surface region is characterized by a second bandgap greater than the first bandgap; and
    forming a Schottky contact electrically coupled to the surface region,
    wherein, during operation, an interface between the III-nitride epitaxial region and the surface region is substantially free from a two-dimensional electron gas, and
    wherein the III-nitride epitaxial region comprises a polar material.

11. The method of claim 10 wherein the certain conductivity type is n-type.

12. The method of claim 10 wherein the surface region is characterized by a thickness between 0.5 nm and 15 nm.

13. The method of claim 12 wherein the thickness is between 1 nm and 3 nm.

14. The method of claim 10 wherein the surface region is formed to comprise at least one of aluminum gallium nitride (AlGaN), aluminum nitride (AlN), aluminum indium nitride (AlInN), or aluminum gallium indium nitride (AlGaInN).

15. The method of claim 14 wherein a concentration of aluminum of the surface region is graded such that the concentration of aluminum increases as a distance to the Schottky contact decreases.

16. A method of fabricating a Schottky diode using gallium nitride (GaN) materials, the method comprising:
providing an n-type GaN substrate having a first surface and a second surface, the second surface opposing the first surface;
forming an ohmic metal contact electrically coupled to the first surface of the n-type GaN substrate;
forming an n-type GaN epitaxial layer coupled to the second surface of the n-type GaN substrate;
forming an n-type aluminum gallium nitride (AlGaN) surface layer coupled to the n-type GaN epitaxial layer; and
forming a Schottky contact electrically coupled to the n-type AlGaN surface layer,
wherein, during operation, an interface between the n-type GaN epitaxial layer and the n-type AlGaN surface layer is substantially free from a two-dimensional electron gas, and
wherein the n-type AlGaN surface layer is characterized by a thickness between 0.5 nm and 15 nm.

17. The method of claim 16 wherein the n-type AlGaN surface layer is characterized by a graded aluminum mole fraction as a function of thickness, wherein the aluminum mole fraction increases as a distance to the second metallic structure decreases.

18. The method of claim 17, wherein the n-type GaN epitaxial layer comprises a polar GaN material.

19. A method of fabricating a Schottky diode using gallium nitride (GaN) materials, the method comprising:
providing an n-type GaN substrate having a first surface and a second surface, the second surface opposing the first surface;
forming an ohmic metal contact electrically coupled to the first surface of the n-type GaN substrate;
forming an n-type GaN epitaxial layer coupled to the second surface of the n-type GaN substrate;
forming an n-type aluminum gallium nitride (AlGaN) surface layer coupled to the n-type GaN epitaxial layer; and
forming a Schottky contact electrically coupled to the n-type AlGaN surface layer,
wherein, during operation, an interface between the n-type GaN epitaxial layer and the n-type AlGaN surface layer is substantially free from a two-dimensional electron gas, and
wherein a concentration of aluminum of the surface layer is graded such that the concentration of aluminum increases as distance to the Schottky contact decreases.

20. A semiconductor device comprising:
a III-nitride substrate having a first surface and a second surface opposing the first surface;
a first metallic structure electrically coupled to the first surface of the III-nitride substrate and forming an ohmic contact with the III-nitride substrate;
a III-nitride epitaxial region characterized by a first bandgap and coupled to the second surface of the III-nitride substrate;
a surface region characterized by a second bandgap and coupled to the III-nitride epitaxial region, wherein the second bandgap is greater than the first bandgap; and
a second metallic structure electrically coupled to the surface region and forming a Schottky contact with the surface region,
wherein, during operation, an interface between the III-nitride epitaxial region and the surface region is substantially free from a two-dimensional electron gas, and
wherein the III-nitride epitaxial region comprises a polar material.

21. The semiconductor device of claim 20, wherein the surface region comprises at least one of aluminum gallium nitride (AlGaN), aluminum nitride (AlN), aluminum indium nitride (AlInN), or aluminum gallium indium nitride (AlGaInN), and wherein a concentration of aluminum of the surface region is graded such that the concentration of aluminum increases as distance to the second metallic structure decreases.

22. The semiconductor device of claim 20, wherein a thickness of the surface region is between 0.5 nm and 15 nm.

23. A semiconductor device comprising:
a III-nitride substrate having a first surface and a second surface opposing the first surface;
a first metallic structure electrically coupled to the first surface of the III-nitride substrate and forming an ohmic contact with the III-nitride substrate;
a III-nitride epitaxial region characterized by a first bandgap and coupled to the second surface of the III-nitride substrate;
a surface region characterized by a second bandgap and coupled to the III-nitride epitaxial region, wherein the second bandgap is greater than the first bandgap; and
a second metallic structure electrically coupled to the surface region and forming a Schottky contact with the surface region,
wherein, during operation, an interface between the III-nitride epitaxial region and the surface region is substantially free from a two-dimensional electron gas, and
wherein the surface region comprises at least one of aluminum gallium nitride (AlGaN), aluminum nitride (AlN), aluminum indium nitride (AlInN), or aluminum gallium indium nitride (AlGaInN), and wherein a concentration of aluminum of the surface region is graded such that the concentration of aluminum increases as distance to the second metallic structure decreases.

24. The semiconductor device of claim 23, wherein the III-nitride epitaxial region comprises a polar material, and wherein a thickness of the surface region is between 0.5 nm and 15 nm.

25. A method of fabricating an epitaxial structure, the method comprising:
providing a III-nitride substrate characterized by a certain conductivity type and having a first surface and a second surface, the second surface opposing the first surface;
forming an ohmic contact electrically coupled to the first surface of the III-nitride substrate;
forming a III-nitride epitaxial region of the certain conductivity type coupled to the second surface of the III-nitride substrate, wherein the III-nitride epitaxial region is characterized by a first bandgap;
forming a surface region coupled to the III-nitride epitaxial region, wherein the surface region is characterized by a second bandgap greater than the first bandgap; and
forming a Schottky contact electrically coupled to the surface region,
wherein, during operation, an interface between the III-nitride epitaxial region and the surface region is substantially free from a two-dimensional electron gas, and
wherein the surface region is characterized by a thickness between 0.5 nm and 15 nm.

26. The method of claim 25, wherein the surface region is formed to comprise at least one of aluminum gallium nitride (AlGaN), aluminum nitride (AlN), aluminum indium nitride (AlInN), or aluminum gallium indium nitride (AlGaInN), and wherein a concentration of aluminum of the surface region is graded such that the concentration of aluminum increases as a distance to the Schottky contact decreases.

27. The method of claim 26, wherein the III-nitride epitaxial region comprises a polar material.

28. A method of fabricating an epitaxial structure, the method comprising:
- providing a III-nitride substrate characterized by a certain conductivity type and having a first surface and a second surface, the second surface opposing the first surface;
- forming an ohmic contact electrically coupled to the first surface of the III-nitride substrate;
- forming a III-nitride epitaxial region of the certain conductivity type coupled to the second surface of the III-nitride substrate, wherein the III-nitride epitaxial region is characterized by a first bandgap;
- forming a surface region coupled to the III-nitride epitaxial region, wherein the surface region is characterized by a second bandgap greater than the first bandgap; and
- forming a Schottky contact electrically coupled to the surface region,
- wherein the surface region is formed to comprise at least one of aluminum gallium nitride (AlGaN), aluminum nitride (AlN), aluminum indium nitride (AlInN), or aluminum gallium indium nitride (AlGaInN), and wherein a concentration of aluminum of the surface region is graded such that the concentration of aluminum increases as a distance to the Schottky contact decreases.

* * * * *